United States Patent [19]

Karlson

[11] 4,052,603

[45] Oct. 4, 1977

[54] OBJECT POSITIONING PROCESS AND APPARATUS

[75] Inventor: Karl Karlson, Fishkill, N.Y.

[73] Assignee: International Business Machines Corporation, Armonk, N.Y.

[21] Appl. No.: 535,905

[22] Filed: Dec. 23, 1974

[51] Int. Cl.² ............... G06F 15/46; H05K 13/00
[52] U.S. Cl. ............... 364/120; 250/566; 355/86; 356/172; 364/300; 364/468
[58] Field of Search ............ 235/151.11, 151.1; 355/53, 78, 86, 95; 444/1; 356/170, 171, 172; 250/208, 209, 566, 224, 237 R

[56] References Cited

U.S. PATENT DOCUMENTS

| | | | |
|---|---|---|---|
| 3,476,476 | 11/1969 | Chitayat | 355/53 |
| 3,490,846 | 1/1970 | Kasper | 355/78 |
| 3,563,648 | 2/1971 | Baggaley | 355/53 |
| 3,598,978 | 8/1971 | Rempert | 235/151.11 |
| 3,718,396 | 2/1973 | Hennings | 356/172 |
| 3,752,589 | 8/1973 | Kobayashi | 356/171 |
| 3,796,497 | 3/1974 | Mathisen et al. | 356/172 |
| 3,844,655 | 10/1974 | Johannsmeier | 355/86 |
| 3,955,072 | 5/1976 | Johannsmeier | 235/151.11 |

*Primary Examiner*—Felix D. Gruber
*Attorney, Agent, or Firm*—David M. Bunnell

[57] ABSTRACT

Objects, such as a pattern mask and a photoresist coated substrate, are placed in translational and/or rotational alignment by a system in which a target on one object is successively aligned to two targets on the other object so that the accuracy of each alignment can be verified. The system compares a known stored distance between alignment targets with the distance determined from the successive alignments. When the distances agree within a preselected tolerance, then the objects are moved into alignment.

30 Claims, 11 Drawing Figures

NON ALIGNED

ALIGNED

| | |
|---|---|
| ALIGN TABLE MARK TO REAR MASK MARK RECORD $X_1, Y_1$ | STEP 1 |
| ALIGN TABLE MARK TO FRONT MASK MARK RECORD $X_2, Y_2$ | STEP 2 |
| DETERMINE $d' = \sqrt{(X_2-X_1)^2 + (Y_2-Y_1)^2}$ COMPARE IF $d'_m = d_m \pm$ TOL. | STEP 3 |
| DETERMINE $M_s \; \theta = \text{Tan}^{-1}\left(\dfrac{X_2-X_1}{Y_2-Y_1}\right)$ | STEP 4 |
| ROTATE MASK INTO ANGULAR ALIGNMENT WITH SYSTEM | STEP 5 |
| MOVE WAFER TO EXPOSURE SITE | STEP 6 |

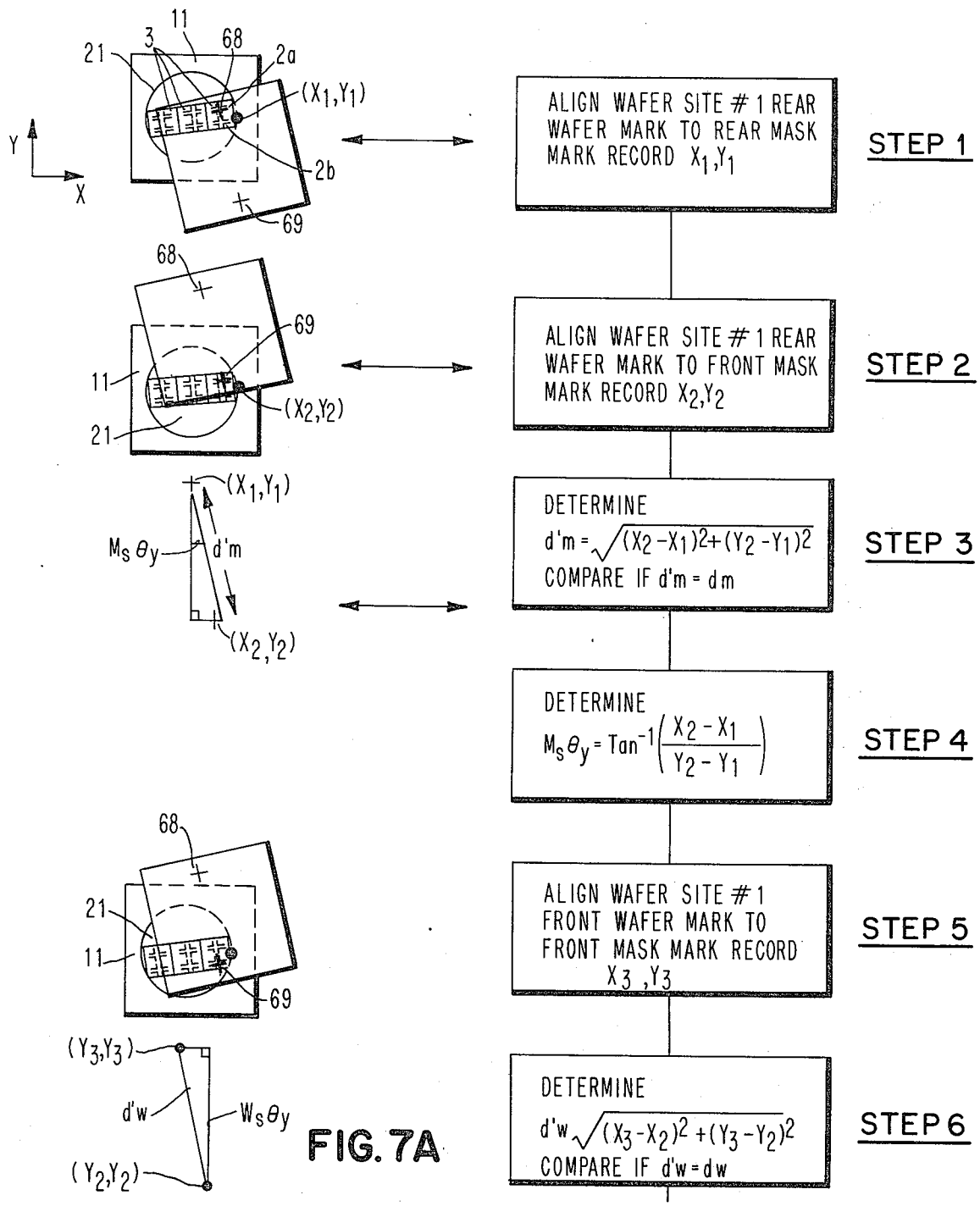

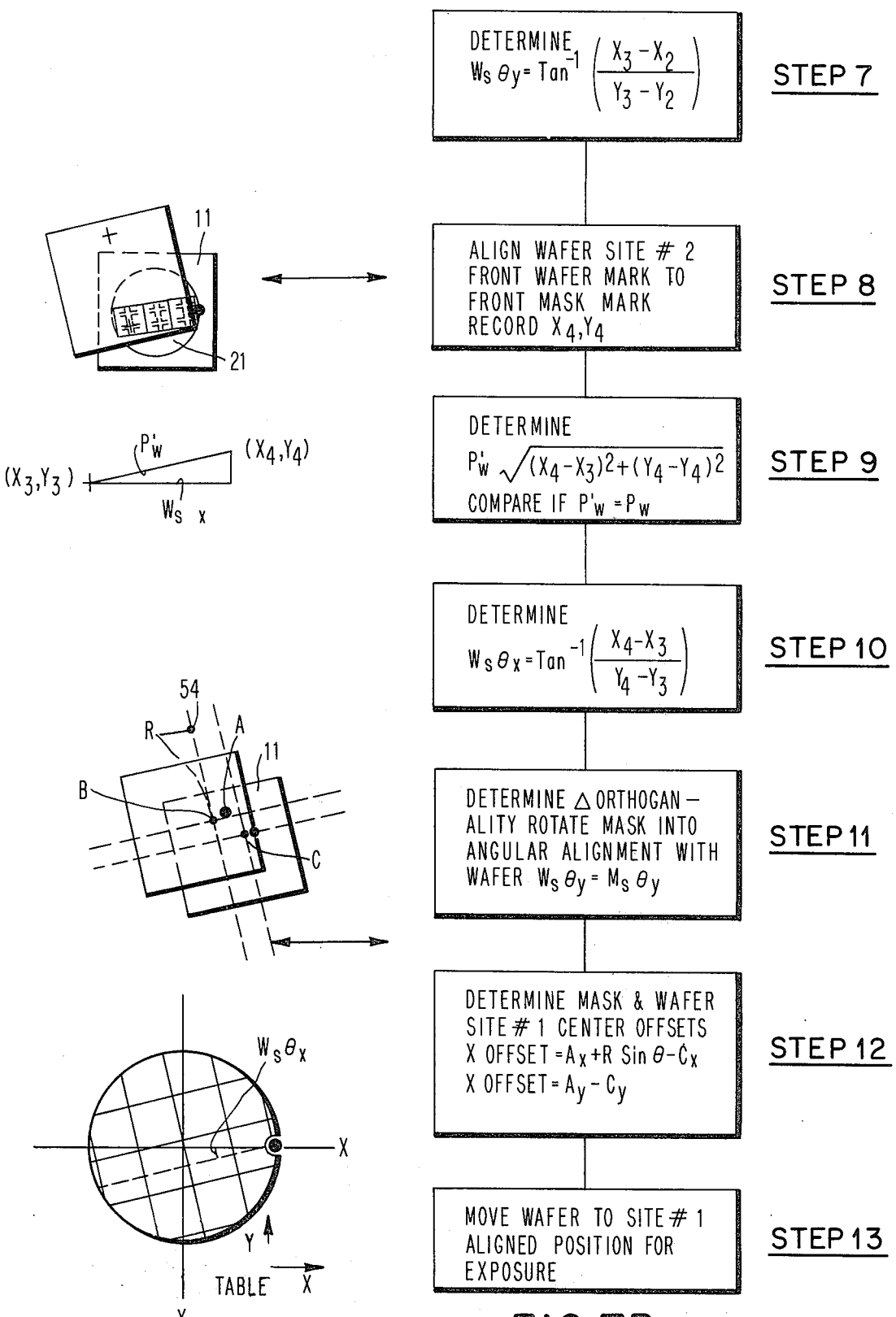

OBJECT POSITIONING PROCESS AND APPARATUS

BACKGROUND OF THE INVENTION

This invention relates generally to the placing of objects into alignment and more specifically to the precise rotational and translational positioning of objects with respect to one another in which the accuracy of the alignment is verified.

In the manufacture of integrated circuits it is necessary to expose with a series of photomasks successive photoresist layers which are used to mask portions of the substrate during processing. Each exposure must be correctly aligned with the existing patterns on the substrate or the yield of finished product will be impaired. This alignment has been done manually in the past by operators who observe the mask and wafer patterns through a microscope or other visual means. In some cases special alignment targets are provided which the operator superimposes. Correct alignments have been found to be subject to human error and fatigue. In attempts to increase throughput and obtain more consistent alignments, automatic alignment systems have been developed in which electro-optical means are employed in order to sense when the wafer and mask patterns, or alignment targets, are in correct alignment. However, because of the varied quality and nature of the patterns being aligned, the automated systems have also been found to be not completely satisfactory in achieving consistent alignments.

In both manual and automated systems it is also difficult to determine whether the alignment has been correctly performed until after the processing step has been completed. Where errors in alignment occur in the later processing steps, the resultant yield losses can be costly.

The subject invention provides for the aligning of objects, such as a mask and resist coated semiconductor wafer, in which positive control over the accuracy of the alignment is exercised.

BRIEF SUMMARY OF THE INVENTION

In accordance with this invention there is provided a process and apparatus for positioning objects.

In one aspect of the invention a first object is placed in rotational alignment with respect to a second object. A pair of marks on the first object are provided which are separated by a known distance. A mark is provided on the second object and the second object is moved until the mark is aligned with one of the marks on the first object. The second object is then moved translationally until the mark on the second object is aligned with the second mark on the first object while the distance of travel of the second object in X and Y orthogonal directions is measured. The distance between the marks on the first object is then determined from the translational movement in X and Y which was required to bring the mark on the second object from alignment with the first mark on the first object into alignment with the second mark on the first object. The determined distance between the marks on the first object is compared with the known distance to verify the accuracy of the alignments. When the mark separation distances agree within a predetermined limit then the rotational position of the objects is determined from the translational movement in the X and Y directions which was required to bring the mark on the second object from alignment with the first mark on the first object into alignment with the second mark on the first object and the relative position of the objects is then changed to bring them into rotational alignment. If the distances do not agree within the required accuracy, then the alignments are repeated as necessary.

In another aspect of the invention, a process and apparatus for placing objects in rotational alignment is provided in which pairs of spaced apart marks are provided a known distance apart on each object. The second object is moved until a first mark on the second object is aligned with a first mark on the first object in order to obtain a first set of coordinates $X_1$, $Y_1$. The second object is then moved translationally until the first mark on the second object is aligned with the second mark on the first object while the distance of travel of the second object in X and Y orthogonal directions is measured to obtain a second set of coordinates $X_2$, $Y_2$. The distance between the marks on the first object is determined from the translational movement in X and Y required to bring the first mark on the second object from alignment with the first mark on the first object to alignment with the second mark on the first object. The determined distance between marks on the first object is then compared with the known distance to verify the accuracy of the alignments. When the known and determined distance agree within a predetermined limit then the rotational position of the first object in relation to the Y direction is determined from the translational movement in X and Y required to bring the first mark on the second object from alignment with the first mark on the first object to alignment with the second mark on the first object. The second object is then moved translationally until the second mark on the second object is aligned with the second mark on the first object while measuring the distance of travel of the second object in the X and Y directions to obtain a third set of coordinates $X_3$, $Y_3$. The distance between the marks on the second object is then determined from the translational movement in X and Y which was required to bring the second mark on the second object into alignment with the second mark on the first object and the determined distance between marks on the second object is compared with the known distance to verify the accuracy of the alignments. When the determined distance and the known distance agree with a predetermined limit then the rotational position of the second object relative to the Y direction is determined from the translational movement in X and Y which was required to bring the second mark on the second object into alignment with the first mark on the first object. The relative position of the objects is then changed to bring them into rotational alignment based on the rotational position of each object with respect to the Y direction.

In another aspect of the invention a process and apparatus for aligning a pattern mask with patterns located at a periodic array of sites on a photoresist coated substrate for step and repeat exposure of the resist to light passing through the mask is provided. Spaced apart alignment marks which are separated by a known distance are provided on the mask with the patterns at two sites on the wafer being provided with corresponding pairs of spaced apart alignment marks which are separated by a known distance. The mask and substrate are supported in parallel planes and the substrate is moved translationally until a first alignment mark at the first site on the substrate is aligned with the first alignment mark on the mask. The substrate is moved translationally until the first alignment mark at the first site is aligned with the second alignment mark on the mask while the distance of travel of the substrate in the X and Y orthogonal directions is measured. The distance between the mask alignment marks is determined from the measured translational movement in X and Y which was required to move the first alignment mark at the first site on the substrate from alignment with the first mask mark to alignment with the second mask mark and the so determined distance between the first and second mask marks is compared with the known distance. When the determined distance and the known distance agree within a predetermined limit then the rotational position of the mask with respect to the Y direction is determined. The substrate is then moved translationally in the X and Y directions until the second alignment mark at the first site on the substrate is aligned with the second mask mark while the distance of travel of the substrate in the X and Y directions is measured. The distance between the substrate alignment marks at the first site is then determined from the measured translational movement and X and Y which was required to move the second alignment mark at the first site into alignment with the second mask mark and the so determined distance is compared with the known distance. When the determined and known distance agree within a predetermined limit the rotational position of the substrate pattern with respect to the Y direction is determined. The substrate is then moved in the X and Y directions until the second alignment mark at a second site on the substrate is aligned with the second mask mark while the distance of travel of the substrate in the X and Y directions is measured. The distance between the second alignment marks at the two sites is determined from the measured translational movement in X and Y required to move the second alignment mark at the second site into alignment with the second mask mark and the so determined distance is compared with the known distance between the second substrate alignment marks at the two sites. When the determined distance and the known distance agree within a predetermined limit then the rotational position of the substrate patterns with respect to the X direction is determined. The mask is rotated such that it is in rotational alignment with the patterns on the substrate based on the rotational position of the substrate and the mask relative to the Y direction. The translational position of the mask and the substrate pattern at the first site on the substrate is determined from the travel in the X and Y directions necessary to align the marks at the first site and the substrate is moved in the X and Y directions to bring the mask and the substrate pattern at the first site into translational alignment. The photoresist layer at the first site is then exposed through the pattern mask. The substrate is then moved in the X and Y directions to bring successive sites into alignment with the pattern mask in accordance with the rotational position of the substrate patterns with respect to the X direction for exposure of the resist at the successive sites.

DESCRIPTION OF THE DRAWINGS

FIGS. 6a & b are plan views illustrating the effect of mask to system angular alignment.

FIGS. 7a & b is a flow chart illustrating a second aspect of the invention for bringing objects into rotational and translational alignment.

FIG. 8 is a plan view illustrating the effect of wafer to system angular alignment.

DETAILED DESCRIPTION

The following detailed description illustrates an embodiment of the invention in which the alignment is semi-automatic in that the alignments are performed by an operator at a control panel. The system presents the operator with a series of alignment patterns on a television monitor and the operator brings the alignment patterns into alignment by moving a joy-stick which actuates motors which move an X-Y table. It should be understood that the invention is equally applicable to automated systems such as where electro-optical means are used to sense the relative position of corresponding patterns on the objects to be aligned.

Figure 1:
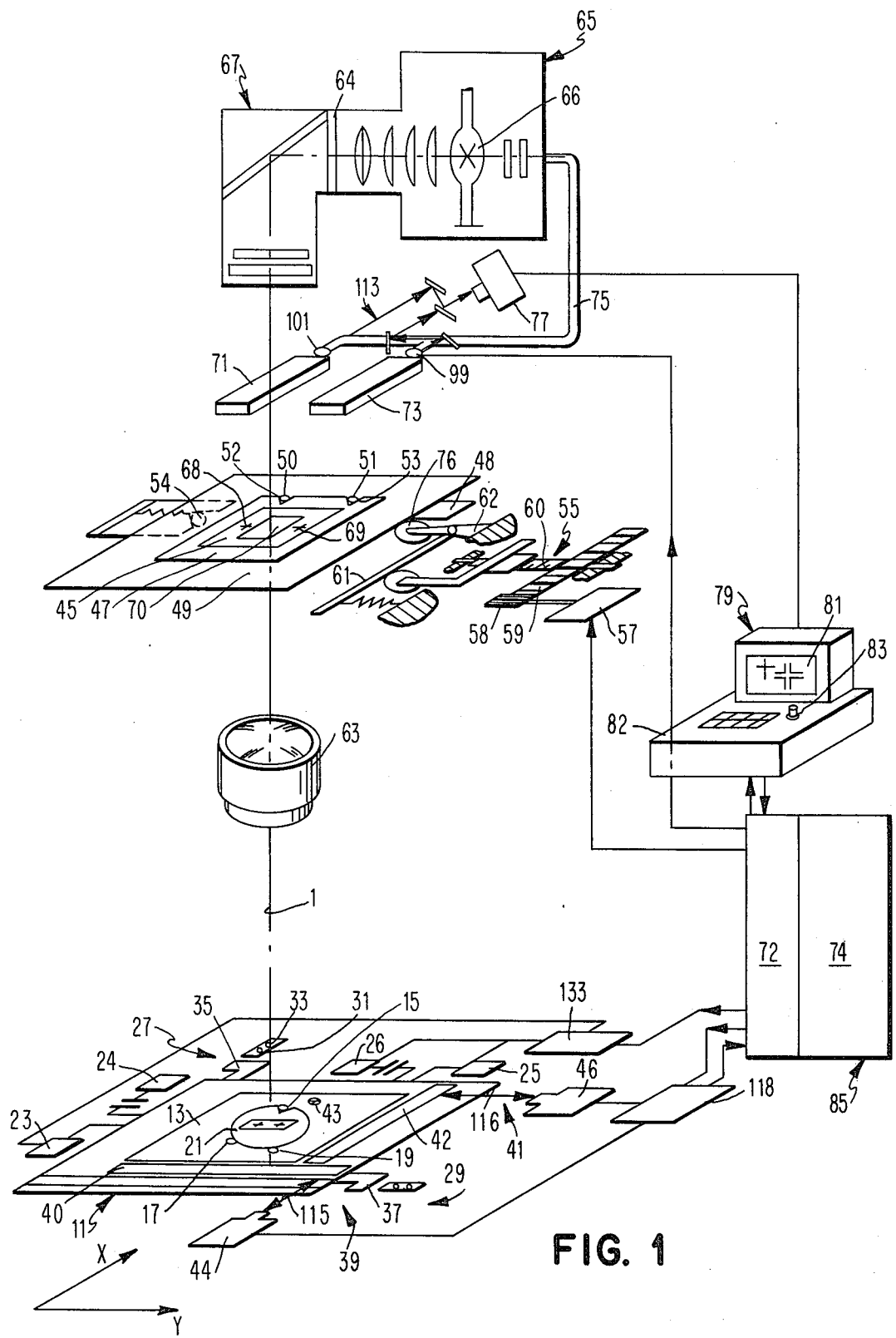
FIG. 1 is a schematic view illustrating an embodiment of an alignment system suitable for carrying out the invention.
Figure 3:
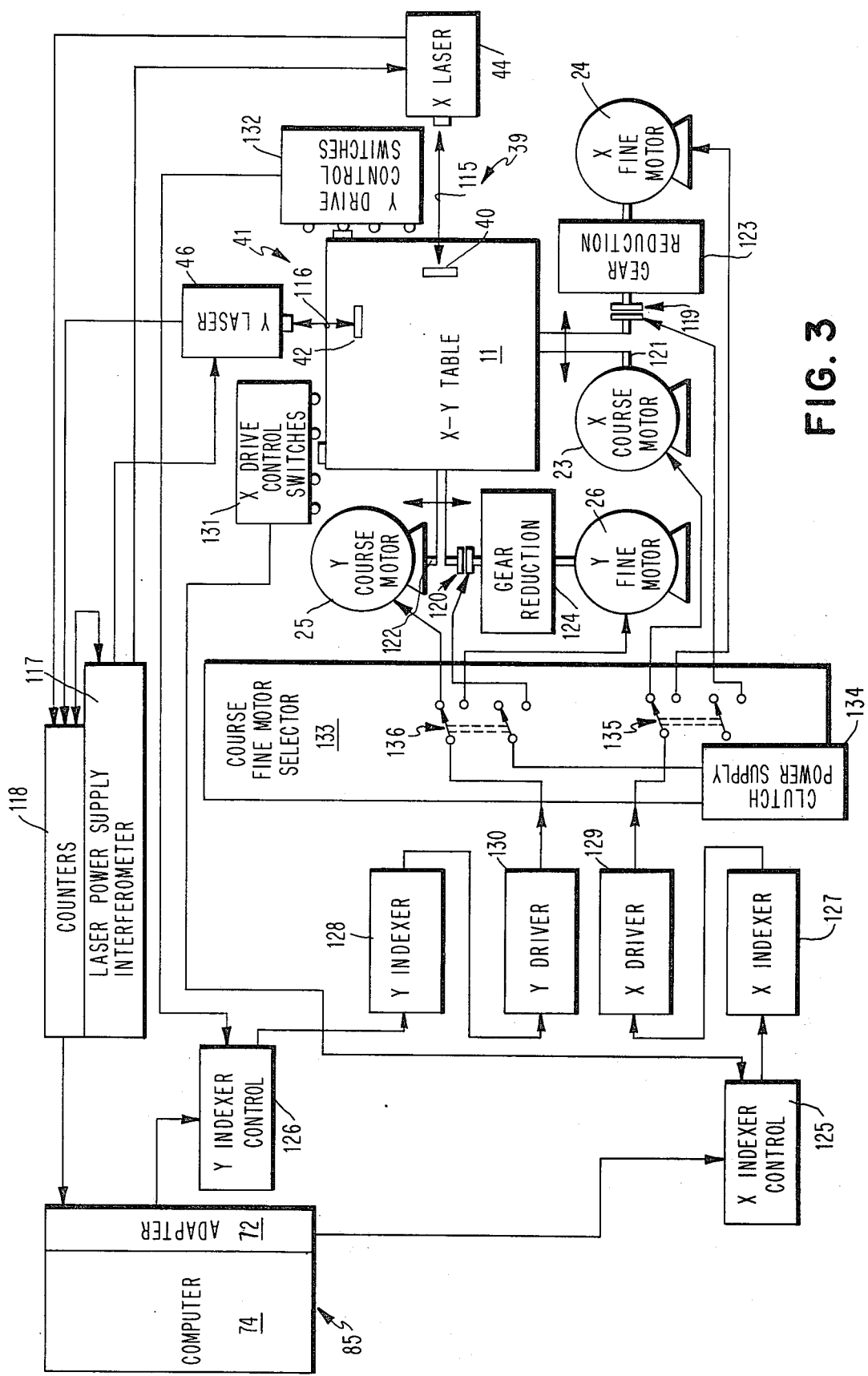
FIG. 3 is a block diagram illustrating the X-Y table stepping motor control system.

FIG. 1 illustrates an alignment system which is used in connection with a projection printing apparatus for the step and repeat exposure of a light sensitive layer through a pattern mask. X-Y table 11 carries a vacuum chuck 13 which has a wafer notch locating pin 15 and reciprocating fingers 17 and 19 which position a substrate such as semiconductor wafer 21 rotationally and translationally on chuck 13. Chuck 13 has a series of vacuum ports (not shown) for maintaining wafer 21 in position during the alignment and exposure sequences. Table 11 is arranged to be driven in X and Y orthogonal directions by stepping motors 23, 24, 25, and 26. A pair of motors, one for the coarse and one for the fine positioning of table 11, is provided for each direction. Table 11 reference position sensors 27 and 29 for bringing the table center to a 0, 0 coordinate reference position in line with the optical axis 1 are provided for the X and Y directions respectively. Sensor 27 for the X direction includes a pair of electric eyes 31 and 33 which are mounted in tandem. Blade 35 is mounted to extend from one side of table 11 in line with electric eyes 31 and 33 and is of a width such that it will block both light beams of electric eyes 31 and 33 simultaneously only when the table is in the correct X reference position. A second blade 37 is provided for the Y direction which operates in conjunction with the electric eyes of sensor 29. Laser interferometers 39 and 41 are provided to measure the position of table 11 in the X and Y directions as is known in the art and include a pair roof prisms 40 and 42 mounted on table 11 with associated lasers 44 and 46. The operation of the stepping motor control system and the laser interferometers is more fully described below and is illustrated in FIG. 3. Table 11 has mounted thereon an alignment reticle 43. Pattern mask 45 is mounted in frame 47 and is positioned on mask holder 49 by notches 52 and 53 on one edge of frame 47 which engage pins 50 and 51 which are mounted on mask holder 49. Mask frame 47 is held in place on holder 49 by a series of vacuum ports (not shown). Mask holder 49 is mounted for rotation about pivot 54 by mask manipulator 55 which includes motor 57, gears 58 and 59, worm drive 60, and actuating levers 61 and 62. The manipulator acts on extended portion 48 of holder 49 through end 76 of lever 62. Holder 49 is arranged to locate mask 45 perpendicular to and on optic axis 1. The projection printing system includes lens 63 located between mask 45 and substrate 21 and a source of collimated light 65. Light source 65 includes mercury arc lamp 66 and two stage condensor system 67. Mask 45 carries a pair of spaced apart alignment marks 68 and 69 located alongside the mask pattern 70 of mask 45. Front and rear alignment fingers 71 and 73 are mounted in line with front and rear alignment marks 68 and 69 respectively and outside of the exposure pattern field of mask 45. This feature permits fingers 71 and 73 to remain in place during the exposure of the resist layer on wafer 21 without interfering with the projection of mask pattern 70 onto the surface of wafer 21. The alignment fingers obtain illumination from the lamp 66 through a bifurcated fiber bundle 75. Suitable shutters 64, 99, and 101 are provided to permit alternate illumination of the front or rear alignment optics and exposure of the wafer through mask pattern 70. TV camera 77 is provided to observe the images provided by the alignment figures of each alignment channel. The images are presented to an operator at control station 79 on CRT monitor 81.

Operator control station 79 includes monitor 81 and control panel 82. The panel has lights which indicate the status of the system and signal the operator when to perform an alignment. Controls are provided for the operator to signal the system that the alignment has been performed or to request that an alternate alignment site be provided. Joy-stick 83 is mounted on panel 82. Joy-stick 83 provides X and Y movement of the X-Y table by inputting the desired direction and the amount of movement desired to control system 85 which actuates the stepping motors 23, 24, 25, and 26 so as to align the wafer patterns or reticle 43 with mask alignment marks 68 and/or 69. Joy-stick 83 is manually movable radially and produces voltages indicative of the desired direction and speed of travel. The analog information is converted to digital information which is fed to a control system 85 which includes, for example, an IBM Model 1826 adaptor 72 and Model 1800 computer 74. Control system 85 then causes stepping motors 23, 24, 25, and 26 to move table 11 at the requested distance, speed and direction. The operator pushes a control button to indicate when he has completed the alignment. Interferometers 39 and 41 have associated counters 118 which record the distance of table travel in the X and Y orthogonal directions as will be hereinafter explained in connection with FIG. 3. Electrical signals are sent to and from control system 85 to the various motors, counters, shutters and the control station 79 by conventional means along the arrows connecting the system subassemblies as schematically shown in FIG. 1.

Figure 2:
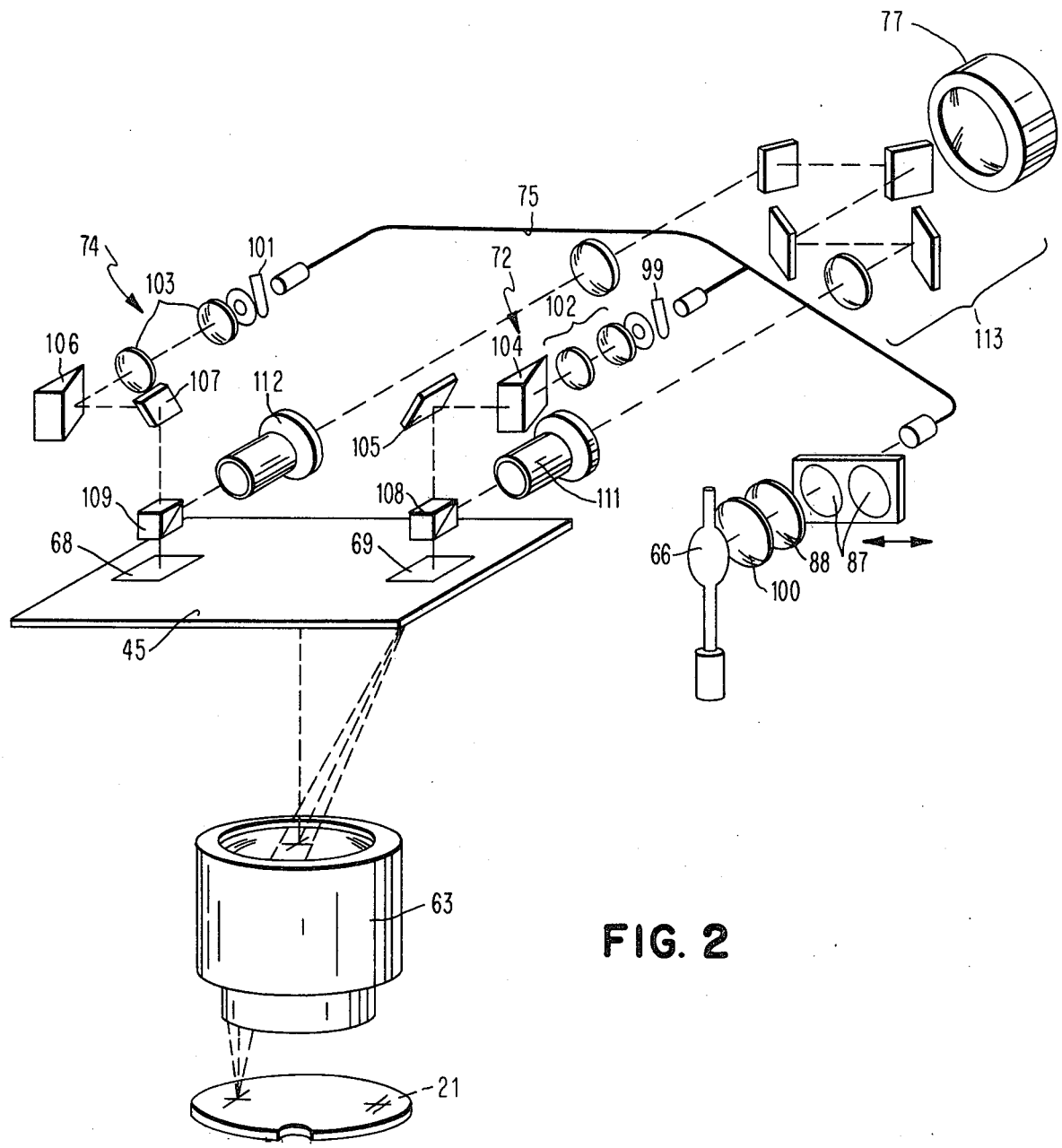
FIG. 2 is a schematic view of the alignment optics.

FIG. 2 illustrates the alignment optics in more detail. Mercury lamp 66, supplies light for the front and rear alignment channels through a bifurcated fiber bundle 75. Premature exposure of the photoresist layer is avoided by suitable intensity filters 87. Each of the fingers 71 and 73 includes an illumination channel 72 and 74 having shutters 99 and 101 second stage condensors 102 and 103, beam adjusting mirrors 104, 105, 106, and 107 and beam splitters 108, and 109. The alignment illumination for each channel passes through alignment marks 68 and 69 on mask 45 and through lens 63. The illumination is reflected from wafer surface 21 (or reticle 43), back through lens 63 and alignment targets 68 and 69. The reticle or wafer alignment targets are imaged in the plane of marks 68 and 69. The images are passed to alignment optics 111 and 112 by means of beam splitters 108 and 109. Images of the alignment marks are alternately provided to television camera 77 by means of relay reflector assembly 113. Either one or the other of the images is presented to camera 77 depending upon the position of shutters 99 and 101 which permit one channel to be viewed at a time. The images are then presented to the operator at the control station on monitor 81. In order to diminish the effect of possible operator bias in making the alignments, an element such as a lens or dove prism can be inserted into one channel which rotates the images 180°.

In the embodiment shown in FIG. 2 a single light source is employed for both alignment and exposure. The mask alignment marks can be placed outside of the exposure field because the corresponding mask and wafer marks are not superimposed when the wafer is moved to the aligned position for exposure but are actually in a non-superimposed position. Accordingly, the alignment fingers do not have to be moved prior to the exposure of the resist layer. This feature simplifies the hardware and eliminates the time needed to remove the reposition the alignment optics.

FIG. 3 illustrates in more detail the X-Y table 11 stepping motor control system and associated interferometer positioning measurement apparatus. Table 11 carries prisms 40 and 42 for reflecting interferometer laser beams 115 and 116 of lasers 44 and 46. The interferometers 39 and 41 provide highly accurate measurement of table travel as is known in the art. The interferometer system includes a counter device 118 which includes a counter for the X and a counter for the Y direction of travel. The laser power supply 117 provides power to the lasers 44 and 46.

Precise movement of wafer table 11 is accomplished by independent control of movement in the X and Y directions. The table drive for each axis is identical and contains a stepping motor for coarse table steps (160 micro inches/step) and a stepping motor for fine table steps (1 micro inch/step). Electronic clutches 119 and 120 engage or disengage the fine drive. Coarse stepping motors 23 and 25 for the coarse drive are directly coupled to drive shafts 121 and 122. Fine stepping motors 24 and 26 are coupled to drive shafts 121 and 122 through 160:1 reduction gear boxes 123 and 124 and the electromagnetic clutches 119 and 120. In operation, only the coarse or the fine stepping motors are engaged at any one time. The coarse drive is selected by de-energizing the clutch then de-energizing the fine motor and energizing the coarse motor. The fine drive is selected by energizing the clutch, then de-energizing the coarse motor and energizing the the fine motor. A switch is provided to permit either computer or manual control. Indexer controls 125 and 126 provide control interface between data adaptor 72 and stepping motor indexers 127 and 128. The indexer controls provide also zero switch and safety limit switch control along with necessary test switches and indicators for manual control and diagnostic testing of the total stepping motor drive system. The stepping motor indexers generate the step pulses and direction signal for the stepping motor drivers 129 and 130 from the control signals received from indexer controls 127 and 128. The indexers control the acceleration and deceleration. The control signals consist of motor direction, distance in motor steps, maximum motor step rate, and an index or start signal. Stepping motor drivers 129 and 130 convert the step pulses and direction signals into a pair of motor drive signals of eight phase type. The motor drive signals are of the proper power to drive the stepping motor windings. The stepping motors convert the two electrical motor drive signals into rotational shaft steps 0.9° (400 steps per 360°). Each motor drive system has a set of drive control switches 131 and 132 consisting of a deceleration switch, a limit switch, and a safety limit switch on each end of each drive axis and a maximum of 3 position switches in the operating range. These control switches properly locate the device position for the controller 85, protect the drives from mechanical damage, and identify proper drive operation or drive failure. The drive control switches are placed along each drive axis to provide a feedback to the process controller 85 at specific locations. Coarse or fine motor selector 133 includes a clutch power supply 134 and switches 135 and 136 for activating either the coarse for fine motor drives. The X-Y table drive is used during the alignment sequence and also to drive the table to the various exposure sites during step and repeat exposure of the mask pattern onto the photoresist coated substrate surface.

Figure 4A:
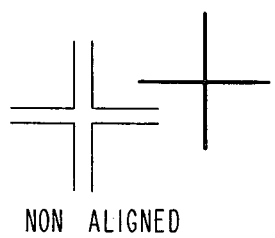
FIGS. 4a & b are plan views of alignment patterns in non-aligned and aligned positions.

In operation, wafer 31 is properly positioned on chuck 13 by the registration fingers which push the wafer against the registration pin after which the wafer is held by vacuum on chuck 13 and the registration fingers are retracted. The proper mask is located on mask holder 49. The Table 11, is then moved in X and Y to its reference position as determined by position sensors 27 and 29 and then is moved a predetermined distance in order to bring either reticle 43 on table 11 or an alignment target on wafer 21 into the field of view of rear alignment channel 72 depending upon whether the mask is the first (no patterns on the wafer) or a subsequent masking level. The accuracy of the table position under the channel is about ±0.5 mil and the alignment channel has a 10 mil field of view. Shutter 99 on rear alignment channel 72 is opened to display the mask alignment mark 69 and either reticle 43 or a wafer alignment mark on monitor 81 at control station 79. The system then signals the operator to perform an alignment. The operator observes the alignment target images and moves joy-stick 83 in the proper direction, which thru the computer activates the X-Y table drive until the alignment target cross is inside and equally spaced from the lines of the Greek cross as illustrated in FIGS. 4a and b. The distance of travel of table 11 is precisely measured by interferometers 39 and 41 and recorded on the X and Y position counters of counter 118. The operator then pushes the control button to indicate that the alignment has been completed and the coordinates of X-Y table 11, as determined by the interferometer counters, are stored in the system controller 85. Shutter 99 is closed and X-Y table 11 is then indexed in the X and Y direction a predetermined distance in order to move the table or wafer alignment target into line with front alignment channel 74 and the front alignment channel shutter 101 is opened to present the superimposed image of the alignment targets to the operator on monitor 81 at control station 79. The operator is then signaled to perform the alignment which is done by moving joy-stick 83. When the alignment has been completed, the operator pushes the alignment completed button and the count on the X and Y counters, as determined by the interferometers 39 and 41, is recorded and stored in the system controller 85. Further alignments are then performed as required by the particular alignment sequence as will be hereinafter described. When the system controller 85 determines that correct alignments have been made, then mask manipulator 55 is actuated to rotate mask 45 about mask holder pivot point 54 the correct angle to either bring the mask to X-Y table system angle to 0 or to bring the mask to wafer pattern angle to 0 as will be hereinafter described.

Figure 5:
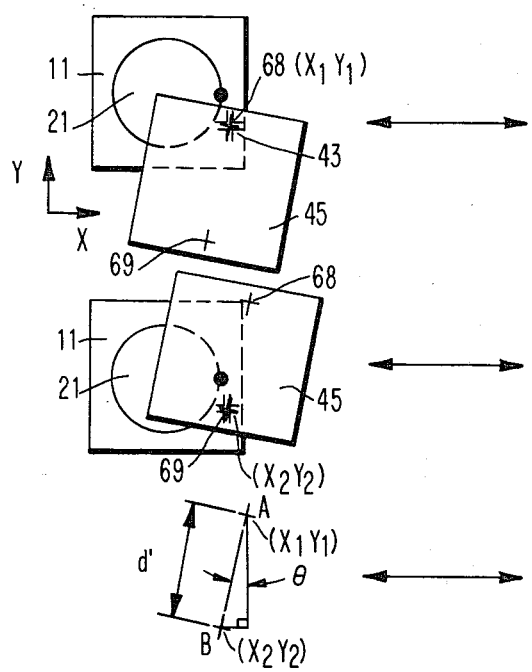
FIG. 5 is a flow chart illustrating one aspect of the invention for bringing objects into rotational alignment.
Figure 5:
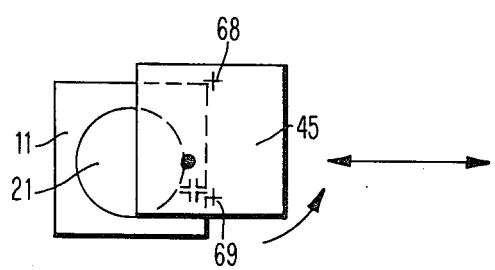

FIG. 5 is a flow diagram of an alignment process according to the invention in which a mask image is to be recorded on the surface of a resist coated semiconductor wafer upon which there are no existing patterns, in other words, for the first or A level mask exposure. The angle of the mask to the X and Y axis of the table is exaggerated for the purpose of illustration. It is necessary for proper orientation of the various sites that the mask to X-Y system angle $\theta$ be made equal within a certain tolerance. This will make the sites line up in checkerboard fashion as illustrated in FIG. 6a. Otherwise, the pattern sites will be skewed when the table is moved in X and Y orthogonal directions as shown in FIG. 6b in an exaggerated manner for the purpose of illustration. As illustrated in FIG. 5, mask 45 has a pair of alignment marks in the form of crosses 68 and 69 which are located on either side of the mask pattern to be exposed on the wafer surface. For the sake of illustration, and the simplest case from a computation standpoint, the crosses are located on a line passing through the center of the mask. It should be understood that the crosses could be located in other positions so long as the position of the crosses with respect to the center of the mask are known. The crosses are in the form of opaque lines on the transparent background and it should be understood that other configurations could be employed to carry out the alignment. For maximum sensitivity in carrying out the alignment it is desirable that the marks be separated by as wide a distance as possible. The position of the field of view of the alignment channels is located in order to coincide with the position of the mask marks. Conventionally, during the A level exposure in which there is no pattern existing on the wafer surface, the mask exposure pattern contains alignment targets which are imaged onto the photoresist layer on the wafer and which are used for subsequent mask level alignments. The wafer alignment marks are conventionally etched, either into the substrate surface itself or a layer, such as an oxide layer, which overlies the surface of the substrate, during the initial etch processing of the substrate. The alignment targets are then in the form of a relief image and of a configuration chosen to be used in connection with the mask alignment marks 68 and 69 to permit accurate alignment be it either visual or electro-optical automatic alignment. For the illustrated embodiment of operator controlled alignment, the reticle and wafer alignment marks are in the form of a Greek cross as illustrated in FIGS. 5 and 7. For A level alignment, in which there are no patterns on the wafer, the alignment reticle 43 secured to table 11 is employed.

As previously discussed, in connection with FIG. 6, if the mask pattern is not angularly aligned to be orthogonal with the travel of the X-Y table then the step and repeat patterns imaged on the wafer will be skewed in the horizontal and vertical directions. Where it is desired to orient patterns at sites so that they line up either for dicing of the wafer or where it is desired to have interconnecting patterns between sites, the mask to system angle $\theta(M_s\theta)$ should be made equal to 0 within a selected tolerance. The purpose of the A level alignment, then, is to rotate the mask such that $M_s\theta$ equals 0 within plus or minus a given error.

Table 11 is first moved to an X-Y reference position 0,0 where the position sensors 27 and 29 stop table 11. The system controller 85 then causes the table to be moved a predetermined distance in X and Y to bring the alignment reticule 43 into the field of view of the rear channel of the alignment system and the shutter for the rear channel is opened so that the marks are presented to the operator on the monitor. The operator proceeds to move joy-stick 83 to place the mask cross inside the Greek cross of reticule 43 as illustrated in the step 1 of the flow diagram in FIG. 5. The coordinates of the X-Y table when the alignment is complete, as measured by the X and Y interferometers, are saved. The X-Y table is then indexed and X and Y a predetermined distance to bring alignment reticule 43 into the field of view of the front alignment channel and the operator performs an alignment such that the cross is located within the alignment reticule as illustrated in FIG. 5 step 2. The difference in the coordinates, $(X_1, Y_1)$ and $(X_2, Y_2)$, between the two alignments as measured by the interferometer and recorded by the X and Y counters is then the travel in X and Y from point A to point B as illustrated in FIG. 5 step 3. The mask to system angle $\theta$ is then determined as illustrated in step 4 by the equation:

$$M_s\theta = \mathrm{Tan}^{-1}(X_2-X_1/Y_2-Y_1)$$

The mask manipulator is then moved to rotate the mask until the mask to system angle $\theta$ is equal to 0 as illustrated in step 5. However, according to the alignment checking feature, prior to moving the mask about the pivot, the correctness of the alignments are checked by comparing the known distance $d$ between the mask marks with the apparent distance $d'$ which is represented by the hypotenuse of the right triangle traced by the movement in X and Y in going from point A to point B as illustrated in step 3 and determined by the formula:

$$d' = \sqrt{(X_2-X_1)^2+(Y_2-Y_1)^2}$$

The known distance $d$ can be measured by any convenient means. For example, ten repetitions of the above alignment process with the average value stored in the system controller 85 memory. For the alignment to be accepted, $d'$ must match $d$ within any selected tolerance. If the distance values do not check then the alignments were faulty at either points A and/or B or there is some problem with the system. If the required check is not achieved then the alignment process is repeated at point B to get new values for the travel in X and Y. If the new coordinates check for $d'$ then these values are used to determine $M_s\theta$. If the new values do not give a suitable value for $d'$ but check with the previously determined coordinates for B, then the first alignment at point A is repeated to see if the new coordinates for A give a suitable value for $d'$. If the results indicate that good alignments were performed each time at both A and B but $d' \neq d$ within the set tolerance then the assumption is that there is some problem with the system. If the second values determined at points A and B differ from the first alignment and no pair of values give $d'=d$ within tolerance then it is assumed that the operator is performing poor alignments and the alignment sequence can be repeated until proper alignments are performed. In any event, the exposure of the wafer site through the mask will not be performed until it is determined that correct alignments have been performed within any selected window of verification and the mask has been rotated so that the mask to system angle has been set equal to 0 within the required tolerance. The process of the invention, therefore, makes it impossible to proceed with an exposure in which the alignment of the mask and wafer is outside of a given tolerance. Alignment in $\theta$ can be checked after rotation by repeating the process to see if $\theta = 0$ and adjusting the mask manipulator accordingly if it is not.

When the mask and table have been properly aligned in $\theta$ then the table is moved to the first exposure site location (step 6). For example, in accordance with coordinates stored in the system controller 85. The shutter of the exposure lamp system is then opened to expose the resist. The table is then stepped to each site to be exposed based on the known periodicity or size of the pattern to be exposed on the wafer. If more than one mask is to be used for the first level exposure, then the alignment routine is repeated for each subsequent mask in order to zero the mask to system angle $\theta$.

Figure 4B:

For the exposure of a succeeding mask level pattern on the wafer, i.e., the B level mask and subsequent levels it is necessary to adjust not only for the mask to system angle but also for the wafer to system angle because the wafer will either not be angularly positioned in the same place on the table as it was in the previous exposure or the wafer may have been positioned and exposed on a different machine which has slightly different errors in its orthogonal travel. The translational position of the mask and the wafer site patterns must also be determined so that the center of the mask pattern will coincide with each exposure site. As shown in the flow diagram of FIG. 7a step 1, the wafer 21 which is positioned on table 11 has a series of device site patterns 3 formed on its surface. Each site includes a pair of alignment marks 2a, 2b which were formed on the wafer during the A level mask exposure and which are used in carrying out each subsequent alignment so that correct pattern overlay of succeeding mask patterns can be achieved. In the embodiment shown, the marks are Greek crosses with the mask marks 68 and 69 being in the form of crosses. Alignment is achieved by centering the mask mark cross inside the Greek cross as was illustrated in FIG. 4. As in the case of the mask alignment targets, the wafer alignment marks can be of any suitable shape and can be located anywhere on the site. It is desirable that maximum separation be used for the purposes of alignment sensitivity. For the simplicity of computation in the illustrated example, the marks are located an equal distance from either side of the center of the device pattern. As in the case of the A level alignment, table 11 is first moved under the control of system controller 85 to the reference position and then a predetermined distance to bring the rear wafer mark 2a into the field of view of the rear alignment channel. The alignment is then made as illustrated in FIG. 7a step 1. The angles of the mask and the site patterns to the X and Y orthogonal axis of the table are exaggerated for the purpose of illustration. The site 1 rear wafer mark 2a is then moved into alignment with the front mask mark 68 using the front alignment channel in order to get the mask to system angle $\theta_y$(steps 2 and 4). The accuracy of the alignments is checked by comparing the determined distance $d'_m$ between the mask alignment marks with the known distance $d_m$ and the alignments are repeated as necessary until the distances agree within the selected tolerances as illustrated in step 3 of FIG. 7a. The wafer to system angle $\theta_y$ is then determined as shown in steps 5 and 7 of FIGS. 7a and b by moving the front wafer mark at site 1 into alignment with the front mask mark where $$W_s\theta_y = \text{Tan}^{-1}(X_3-X_2/Y_3-Y_2)$$

The correctness of the alignment is verified by checking the known distance between the wafer site alignment marks with the distance determined by the formula $$d'_w = \sqrt{(X_3-X_2)^2+(Y_3-Y_2)^2}$$

as illustrated in step 6. The alignments are repeated as necessary until $d'_w$ equals $d_w$ within the selected tolerance.

The mask to wafer angle could then be made equal to 0 based on the difference between the mask to system $\theta_y$ and the wafer to system $\theta_y$ with the mask being rotated by the manipulator such that the mask to wafer angle $\theta$ equals 0 with any selected tolerance. This could be done at this point, for example, in the case of every site alignment for either high accuracy when using a high yawing X-Y table or for exposing test sites. However, for step and repeat exposure, even though the mask and wafer are aligned in $\theta_y$, then the step and repeat exposure process based on a single site alignment will not produce superimposed images because the mask and wafer patterns will still not be orthogonal to the travel of the X-Y table (see FIG. 8) unless the wafer pattern to system angle happened to be equal to zero. The proper stepping coordinates may not be determinable from $W_s\theta_y$ due to variations in the orthogonality of the system. This is particularly true when the A level exposure was done on a different machine. Therefore, it is necessary to determine the wafer to system $\theta_x$ in order to determine the proper stepping coordinates for each exposure site. In this manner the process of the invention avoids the effects of both wafer to system alignment and the non-orthogonality of the X-Y tables which are used. Accordingly, the wafer is indexed to move the front wafer mark at a second site on the wafer into alignment with the front mask mark as shown in step 8 of FIG. 7b. The wafer to system $\theta_x$ is determined as shown in FIG. 7b step 10 by the formula:

$$W\theta_x = \text{Tan}^{-1}(X_4-Y_3/Y_4-Y_3).$$

The correctness of the alignment is checked by knowing the periodicity of the site patterns (i.e., the distance between the front wafer marks of site 1 and site 2 $P_w$) and then comparing those with the determined distance from the formula:

$$P'_w = 2\sqrt{(X_4-X_3)^2+(Y_4-Y_3)^2}$$

as shown in step 9. When a check within the selected tolerance is obtained, then the mask is rotated in order to correct for the difference in orthogonality between the mask and wafer patterns such that the mask to system $\theta_y$ = the wafer to system $\theta_y$ as determined in step 4 and 7 and shown in step 10. The offset of the mask to wafer centers must be then determined in order to translationally align the mask pattern with the wafer site for exposure (step 12). This is accomplished from the data obtained at the site 1 alignments where the mask center before rotation equals A, the mask center after rotation equals B, and the wafer center equals C.

The X offset is equal to $B_x - C_x$ in system coordinates. $B_x$ is determined by the shift in X due to the rotation of the mask about pivot point 54 and is given by the formula:

$$B_x = A_x + R \sin \theta + (\Delta R \sin \theta)$$

Where R is the distance between pivot point 54 and the mask center and $\theta$ is the angle the mask was rotated to align it with the wafer. The $+(\Delta R \sin \theta)$ term is a correction term which is a function of the uncertainty of the placement of the mask into the mask manipulator. The term is found to be insignificant because $\theta$ normally will be within the range of only $\pm \frac{1}{8}°$ and the uncertainty of mask placement is small. Accordingly, X offset $= A_x + R \sin \theta - C_x$ The Y offset is given by the formula:

$$Y \text{ offset} = A_y - C_y$$

because the shift in Y due to the small angle of rotation is de minimus and the correction term drops out.

The offsets can then be calculated using the site 1 alignment data where:

$$A_x = \frac{X_1 + X_2}{2}$$

$$A_y = \frac{Y_1 + Y_2}{2}$$

$$C_x = \frac{X_2 + X_3}{2}$$

$$C_y = \frac{Y_2 + Y_3}{2}$$

In the event that the manipulator movement is not accurate due, for example, to translational movement about pivot point 54, additional alignments can be carried out after rotation prior to calculating the offsets. A fifth alignment is carried out at site 2 which repeats the fourth alignment of front wafer mark to front mask mark followed by a sixth alignment of front wafer mark to rear mask mark at site 2. This permits a $M_s\theta_y$ determination at site 2 to see if $M_s\theta_y = W_s\theta_y$. If not, then the mask is rotated to the proper position as verified by repeating the fifth and sixth alignments in reverse. A seventh alignment of rear wafer to rear mask is made. These three alignments reproduce the same steps carried out at site 1 and the mask and wafer center offsets are calculated using the site 2 data obtained after mask rotation so that no errors are introduced due to errors in manipulator movement accuracy.

It is also possible to modify the apparatus so as to rotate the mask about its center rather than about a point adjacent the mask. In this case $R = 0$ and the X offset is given by $A_x - C_x$.

It is also possible to automatically rotate and/or translate the mask a small additional amount the magnitude of which is stored in controller 85. This will count for any known systematic offsets due either to the system or the particular mask set.

The exposure of the substrate, whether at A level or a subsequent level, can be carried out using more than one mask for exposing different sites on the wafer to different patterns. In this case the first mask is replaced by a second mask. The rear wafer to rear mask and rear wafer to front mask alignment process is carried out in order to angularly align the second mask to the X-Y table in the case of A level exposure or to the wafer in subsequent levels. Because the wafer to system angle does not change, a second site alignment is not needed. The third alignment of rear wafer mask to rear mask mark is carried out and verified and the X and Y offsets are calculated as before.

If desired the first site alignment process can be repeated at each site for each exposure. This may be desirable for example, when an X-Y table of poor orthogonality is used.

The process and apparatus of the invention permit the ability to preselect the final overlay of patterns via comparison tolerancing which is independent of any particular operator or automatic control system. If the required overlay is not achieved, then exposure will not take place. The process and apparatus have been described with respect to operator alignment but is equally applicable to automatic alignments where the relative position of alignment targets are detected without operator participation. For example, using electro-optic means in which the images of the alignment marks are scanned past a photodetector to produce electrical signals which are indicative of the location of the alignment marks as is known in the art.

While the invention has been particularly shown and described with reference to preferred embodiments thereof, it will be understood by those skilled in the art that various changes in form and detail may be made therein without departing from the spirit and scope of the invention.

What is claimed is:

1. In a process for placing a first object into rotational alignment with respect to a second object, said process employing a system for supporting and moving said objects with respect to one another, which system includes alignment optics and position measurement apparatus for recording position information and for measuring and recording distances, said first object being provided with a pair of spaced apart alignment marks which are separated by a known distance which is stored in said system, and said second object being provided with a mark, said system performing the steps of:
   a. moving the second object translationally until the mark on the second object is optically aligned with one of the marks on the first object;
   b. moving the second object translationally until the mark on the second object is optically aligned with the second mark on the first object while generating and counting electrical signals which measure the distance of travel of the second object in X and Y orthogonal directions and recording the counts in X and Y directions representing the new position of the second object;
   c. determining the distance between the marks on the first object from the recorded counts representing the translational movement in X and Y which was required to bring the marks on the second object from alignment with the first mark on the first object into alignment with the second mark on the first object;
   d. comparing the determined distance between the marks on the first object with the known distance in order to verify the accuracy of the alignments;
   e. determining the rotational position of the objects from the counts representing the measured translational movement, in the X and Y directions, which was required to bring the mark on the second object from the alignment with the first mark on the first object to alignment with the second mark on the first object from alignments according to steps a and b where the mark separation distances agree within a predetermined limit, and;
   f. changing the relative position of the objects to bring them into rotational alignment.

2. In a process for placing objects in rotational alignment, said process employing a system for supporting and moving said objects with respect to one another, which system includes alignment optics and position measurement apparatus for recording position information and for measuring and recording distances, each object being provided with pairs of spaced apart marks, the marks of each pair being separated by known distances which are stored in said system, said system performing the steps of:
   moving the second object with said system until a first mark on the second object is optically aligned with a first mark on the first object while generating and counting electrical signals which measure the distance of travel of the second object in X and Y directions in order to obtain X and Y counts representing a first set of coordinates $X_1$, $Y_1$ which are stored in said system;
   b. moving the second object translationally until the first mark on the second object is optically aligned with the second mark on the first object while generating and counting electrical signals measuring the distance of travel of the second object in X and Y orthogonal directions to obtain X and Y counts representing a second set of coordinates $X_2$, $Y_2$ which are stored in said system;
   c. determining the distance between the marks on the first object from the recorded counts representing the measured translational movement in X and Y of step b and comparing the determined distance between marks on the first object with the known distance in order to verify the accuracy of the alignments;
   d. repeating steps a, b and c as necessary until the accuracy is within a predetermined limit;
   e. determining the rotational position of the first object in relation to the Y direction from the counts representing the measured translational movement in X and Y of step b as determined from the alignments which gave an accuracy within a predetermined limit;
   f. moving the second object translationally until the second mark on the second object is optically aligned with the second mark on the first object while generating and counting electrical signals measuring the distance of travel of the second object in the X and Y orthogonal directions to obtain X and Y counts representing a third set of coordinates $X_3$, $Y_3$ which are stored in said system;
   g. determining the distance between the marks on the second object from the recorded counts representing the measured translational movement in X and Y of step f and comparing the determined distance between marks on the second object with a known distance in order to verify the accuracy of the alignments;
   h. repeating steps b, f, and g as necessary until the accuracy is within said predetermined limit;
   i. determining the rotational position of the second object relative to the Y direction from the counts representing the measured translational movement in X and Y of step f as determined from the alignments which gave an accuracy within said predetermined limit, and;
   j. changing the relative position of the objects to bring them into rotational alignment based on the rotational position of each object with respect to the Y direction.

3. The process of claim 2 in which said first object is a pattern mask and said second object is an X-Y table.

4. The process of claim 3 in which the first object is a pattern mask and the second object is a semiconductor wafer coated with a light sensitive layer.

5. In a process for aligning a pattern mask with patterns located at a periodic array of sites on a photoresist coated substrate for step and repeat exposure of the resist to light passing through the mask, said process employing a system for supporting and moving the mask and the wafer with respect to one another, which system includes alignment optics and position measurement apparatus for recording position information and for measuring and recording distances, said mask being provided with spaced apart alignment marks which are separated by a known distance which is stored in said system, and said wafer being provided with patterns at two sites on the wafer the patterns having corresponding pairs of spaced apart alignment marks which are separated by a known distance which is stored in said system, said system performing the steps of:

a. supporting the mask and substrate in parallel planes; moving the substrate until a first alignment mark at the first site on the substrate is optically aligned with the first alignment mark on the mask;

c. moving the substrate translationally until the first alignment mark on the first site is optically aligned with the second alignment mark on the mask while generating and counting electrical signals measuring the distance of travel of the substrate in X and Y orthogonal directions and recording the counts in X and Y directions representing the new position of the substrate;

d. determining the distance between the mask alignment marks from the counts representing the measured translational movement in X and Y of step c as recorded by said position measurement apparatus and comparing the so determined distance between the first and second mask marks with a known distance in order to verify the accuracy of the alignments;

e. repeating steps b, c and d as necessary until the accuracy is within a predetermined limit;

f. determining the rotational position of the mask with respect to the Y direction from the counts representing the measured translational movement in X and Y as determined from the alignments in steps b, c, and e which gave an accuracy within a predetermined limit;

g. moving the substrate translationally until the second alignment mark at the first site on the substrate is optically aligned with the second mask mark while generating and counting electrical signals measuring the distance of travel of the substrate in the X and Y orthogonal directions and recording the counts in X and Y directions representing the new position of the substrate;

h. determining the distance between the substrate alignment marks at the first site from the counts representing the measured translational movement in X and Y of step g as recorded by said position measurement apparatus and comparing the so determined distance with the known distance in order to verify the accuracy of the alignments;

i. repeating steps c, g, and h as necessary until the accuracy is within said predetermined limit;

j. determining the rotational position of the substrate pattern with respect to the Y direction from the counts representing the measured translational movement in X and Y as determined from the alignments in steps c, g, and i which gave an accuracy within a predetermined limit;

k. moving the substrate translationally until the second mark at a second site on the substrate is optically aligned with the second mask mark while generating and counting electrical signals measuring the distance of travel of the substrate in the X and Y orthogonal directions and recording the counts in X and Y directions representing the new position of the substrate;

l. determining the distance between the second alignment marks at the two sites on the substrate from the counts representing the measured translational movement in X and Y of step k and comparing the so determined distance with the known distance which is stored in said system between the second alignment marks at the two sites in order to verify the accuracy of the alignments;

m. repeating steps g, k, and l as necessary until the accuracy is within said predetermined limit;

n. determining the rotational position of the substrate patterns with respect to the X direction from the counts representing the measured translational movement in X and Y as determined from the alignments in steps g, k, and m which gave an accuracy within a predetermined limit;

o. rotating the mask to bring it into rotational alignment with the patterns on the substrate based on the rotational position of the substrate and the mask relative to the Y direction;

p. determining the translational position of the center of the mask and the center of the site to be exposed;

q. moving the substrate translationally to bring the mask and the substrate pattern site to be exposed into translational alignment, and;

r. exposing the photoresist layer at the site to be exposed by passing light through the pattern mask into the photoresist layer.

6. The process of claim 5 in which the substrate is moved translationally to bring successive sites into alignment with the pattern mask in accordance with the rotational position of the substrate patterns with respect to the X direction for exposure of the resist at the successive sites.

7. The process of claim 6 in which the pattern mask is replaced by a second mask which is aligned with the substrate in order to expose a site on said substrate.

8. The process of claim 6 in which said substrate is moved translationally by an X-Y table.

9. The process of claim 8 in which said substrate is a semiconductor wafer having a periodic array of device patterns.

10. In a process for aligning a pattern mask with patterns located at a periodic array of sites on a photoresist coated substrate for step and repeat exposure of the resist to light passing through the mask, said process employing a system for supporting and moving the mask and the substrate with respect to one another, which system includes alignment optics and position measurement apparatus for recording position information and for measuring and recording distances, said mask being provided with spaced apart alignment marks which are separated by a known distance which is stored in said system, and said array of sites in the substrate being provided with patterns said patterns having corresponding pairs of spaced apart alignment marks which are separated by a known distance which is stored in said system, said system performing the steps of:

a. supporting the mask and substrate in parallel planes;
b. moving the substrate until a first alignment mark at a first site on the substrate is optically aligned with the first alignment mark on the mask;
c. moving the substrate translationally until the first alignment mark on the first site is optically aligned with the second alignment mark on the mask while generating and counting electrical signals measuring the distance of travel of the substrate in X and Y orthogonal directions and recording the counts in X and Y directions representing the new position of the substrate;
d. determining the distance between the mask alignment mark from the counts representing the measured translational movement in X and Y of step c as recorded by said position measurement apparatus and comparing the so determined distance between the first and second mask marks with a known distance in order to verify the accuracy of the alignments;
e. repeating steps b, c, and d as necessary until the accuracy is within a predetermined limit;
f. determining the rotational position of the mask with respect to the Y direction from the counts representing the measured translational movement in X and Y as determined from the alignments in steps b, c, and e which gave an accuracy within a predetermined limit;
g. moving the substrate translationally until the second alignment mark at the first site on the substrate is optically aligned with the second mask mark while generating and counting electrical signals measuring the distance of travel of the substrate in the X and Y orthogonal directions and recording the counts in X and Y directions representing the new position of the substrate;
h. determining the distance between the substrate alignment marks at the first site from the counts representing the measured translational movement in X and Y of step g as recorded by said position measurement apparatus and comparing the so determined distance with the known distance in order to verify the accuracy of the alignments;
i. repeating steps c, g, and h as necessary until the accuracy is within said predetermined limit;
j. determining the rotational position of the substrate pattern with respect to the Y direction from the counts representing the measured translational movement in X and Y as determined from the alignments in steps c, g, and i which gave an accuracy within a predetermined limit;
k. rotating the mask to bring it into rotational alignment with the patterns on the substrate based on the rotational position of the substrate and the mask relative to the Y direction;
l. determining the translational position of the center of the mask and the center of the pattern at said first site;
m. moving the substrate translationally to bring the mask and said first site into translational alignment;
n. exposing the photoresist layer at said first site by passing light through the pattern mask onto the photoresist layer, and;
o. repeating steps b through m for each site of said array which is to be exposed through said mask.

11. The process of claim 10 in which the pattern mask is replaced by a second mask which is aligned with the substrate in order to expose a site on said substrate.

12. The process of claim 10 in which said substrate is moved translationally by an X-Y table.

13. The process of claim 12 in which said substrate is a semiconductor wafer having a periodic array of device patterns.

14. A system for angularly positioning a first object with respect to a second object, said system comprising:

a. means for supporting and moving the objects with espect to one another,
b. means for measuring and recording the position and distance of travel of said second object,
c. system control means, said means including a control station;
d. a pair of spaced apart alignment marks on said first object which are separated by a known distance which is stored in said system control means,
e. an alignment mark on said second object,
f. alignment optics for observing the relative position of the alignment marks, said system control means performing the functions of:

1. directing said system to move said second object until the mark on said second object and a first of said marks on said first object are in the field of view of said alignment optics,
2. directing said system to move said second object in response to electrical signals received from said control station and to record the position of said second object when said mark on said second object is aligned with the first of said marks on said first object,
3. directing said system to move said second object unitl the mark on said second object and the second of said marks on said first object are in the field of view of said alignment optics,
4. directing said system to move said second object in response to electrical signals received from said control station and to record the position of said second object when said mark on said second object is aligned with the second of said marks on said first object,
5. determining the distance between said pair of marks from the change in position of said second object as recorded by said system,
6. comparing the so determined distance between said pair of marks with said known distance to verify the accuracy of said alignments,
7. requiring further alignments as necessary until the accuracy is within a selected tolerance,
8. determining the angular position of said objects from the change in position of said second object as determined from alignments which give an accuracy within a selected tolerance, and
9. directing the system to change the rotational position of said objects until they are angularly aligned.

15. The system of claim 14 wherein said first object is a pattern mask and said second object is an X-Y table.

16. A system for placing a first object into rotational alignment with respect to a second object, said system comprising:

a. means for supporting and moving the objects with respect to one another, b. means for measuring and recording the position and distance of travel of said second object, c. system control means, said means including a control station;

d. a pair of spaced apart alignment marks on said first object which are separated by a known distance which is stored in said system control means, e. an alignment mark on said second object, f. alignment optics for observing the relative position of the alignment marks, said system control means performing the functions of:

1. directing said system to move the second object translationally in response to electrical signals received from said control station until the mark on the second object is optically aligned with one of the marks on the first object;
2. directing said system to move the second object translationally in response to electrical signals received from said control station until the mark on the second object is optically aligned with the second mark on the first object and to measure and record the distance of travel of the second object in X and Y orthogonal directions;
3. determining the distance between the marks on the first object from the recorded translational movement in X and Y which was required to bring the marks on the second object from alignment with the first mark on the first object into alignment with the second mark on the first object;
4. comparing the determined distance between the marks on the first object with the known distance in order to verify the accuracy of the alignments;
5. determining the rotational position of the objects from the measured translational movement, in the X and Y directions, which was required to bring the mark on the second object from the alignment with the first mark on the first object to alignment with the second mark on the first object from alignments where the mark separation distances agree within a predetermined limit, and;
6. directing the system to change the relative position of said objects to bring them into rotational alignment.

17. A system for placing first and second objects in rotational alignment, said system comprising:

a. means for supporting said objects and for moving said second object in X and Y orthogonal directions;

b. means for measuring and recording the X and Y coordinate position and distance of travel of said second object;

c. system control means, said means including a control station;

d. a pair of spaced apart alignment marks on said first object which are separated by a known distance which is stored in said system control means;

e. a pair of spaced apart alignment marks on said second object which are separated by a known distance which is stored in said system control means;

f. alignment optics;

said system control means performing the functions of:

1. directing said system to move said second object translationally in response to electrical signals received from said control station and to record the coordinate position, $X_1$, $Y_1$ of said second object when a first mark on said second object is aligned with a first mark on said first object,
2. directing said system to move said second object translationally in response to electrical signals received from said control station and to record the coordinate position $X_2$, $Y_2$ of said second object when said first mark on said second object is aligned with the second mark on said first object,
3. determining the distance between said marks on said first object from the change in the X and Y coordinate position of said second object as recorded by said system,
4. comparing the so determined distance between said marks on said first object with the known distance to verify the accuracy of the alignments,
5. requiring further alignments as necessary until the accuracy is within a predetermined limit,
6. determining the rotational position of said first object in relation to the Y direction from the translational movement in X and Y from $X_1$, $Y_1$ to $X_2$, $Y_2$ as determined from alignments which gave an accuracy within said predetermined limit,
7. directing said system to move said second object translationally in response to electrical signals received from said control station and to record the coordinate position $X_3$, $Y_3$ of said second object when the second mark on said second object is aligned with said second mark on said first object,
8. determining the distance between said marks on said second object from the change in the X and Y coordinate position of said second object in moving to $X_3$, $Y_3$ as recorded by said system,
9. comparing the so determined distance between said marks on said second object with the known distance to verify the accuracy of the alignments,
10. requiring further alignments as necessary until the accuracy is within a predetermined limit,
11. determining the rotational position of said second object in relation to the Y direction from the translational movement in X and Y from $X_2$, $Y_2$ to $X_3$, $Y_3$ as determined from alignments which gave an accuracy within said predetermined limit, and
12. directing said system to change the relative position of the objects to bring them into rotational alignment based on the rotational position of each object with respect to the Y direction.

18. The system of claim 17 in which said first object is a pattern mask and said second object is an X-Y table.

19. The system of claim 17 in which said first object is a pattern mask and said second object is a semiconductor wafer which is coated with a light sensitive layer.

20. A system for aligning a pattern mask with patterns located at a periodic array of sites on a photoresist coated substrate for step and repeat exposure of the photoresist to light passing through the mask, said system comprising;

a. means for supporting and moving the mask and substrate with respect to one another in parallel planes;

b. means for measuring and recording the X and Y coordinate position and distance of travel of the substrate;

c. system control means, said means including a control station;

d. a pair of spaced apart alignment marks on the mask which are separated by a known distance which is stored in said system control means;
e. patterns at two sites on the substrate with the patterns having corresponding pairs of spaced apart alignment marks which are separated by a known distance which is stored in said system control means;
f. alignment optics;
g. exposure means to image the pattern mask onto the photoresist coated substrate;

said system control means performing the functions of:

1. directing said system to move the substrate in response to electrical signals received from said control station until a first mark at the first site on the substrate is optically aligned with the first alignment mark on the mask;
2. directing said system to move the substrate translationally in response to electrical signals received from said control station until the first alignment mark at the first site is optically aligned with the second alignment mark on the mask while measuring the distance of travel of the substrate in X and Y orthogonal directions;
3. determining the distance between the mask alignment marks from the measured translational movement in X and Y of (2) as recorded by said means for measuring and recording and comparing the so determined distance between the first and second mask marks with the known distance in order to verify the accuracy of the alignments;
4. requiring further alignments as necessary until the accuracy is within a selected tolerance;
5. determining the rotational position of the mask with respect to the Y direction from the alignments which gave an accuracy within said predetermined limit;
6. directing said system to move the substrate translationally in response to electrical signals received from said control station until the second alignment mark at the first site on the substrate is optically aligned with the second mask mark while measuring the distance of travel of the substrate in the X and Y orthogonal directions;
7. determining the distance between the substrate alignment marks at the first site from the measured translational movement in X and Y of (6) as recorded by said means for measuring and recording and comparing the so determined distance with the known distance in order to verify the accuracy of the alignments;
8. requiring further alignments as necessary until the accuracy is within said predetermined limit;
9. determining the rotational position of the substrate pattern with respect to the Y direction from the alignments which gave an accuracy within a predetermined limit;
10. directing said system to move the substrate translationally in response to electrical signals received from said control station until the second mark at a second site on the substrate is optically aligned with the second mask mark while measuring the distance of travel of the substrate in the X and Y orthogonal directions;
11. determining the distance between the second alignment marks at the two sites on the substrate from the measured translational movement in X and Y of (10) and comparing the so determined distance with the known distance which is stored in said system between the second alignment marks at the two sites in order to verify the accuracy of the alignments;
12. requiring further alignments as necessary until the accuracy is within said predetermined limit;
13. determining the rotational position of a substrate patterns with respect to the X direction from the alignments which gave an accuracy within a predetermined limit;
14. directing said system to rotate the mask to bring it into rotational alignment with the patterns on the substrate based on the rotational position of the substrate and the mask relative to the Y direction;
15. determining the translational position of the center of the mask and the center of the site to be exposed;
16. directing said system to move the substrate translationally to bring the mask and the substrate pattern site to be exposed into translational alignment, and
17. directing said system to expose the photoresist at the site by imaging the pattern mask onto the photoresist coated substrate.

21. The system of claim 20 in which said control means directs said system to move the substrate translationally to bring successive sites into alignment with the pattern mask in accordance with the rotational position of the substrate patterns with respect to the X direction for exposure of the photoresist a the successive sites.

22. The system of claim 21 in which the substrate is a semiconductor wafer having a periodic array of device patterns.

23. The system according to claim 20 in which the pattern mask is replaced by a second pattern mask which is aligned with the substrate in order to expose a site on said substrate.

24. The system of claim 20 wherein the means for supporting and moving the mask and substrate includes an X-Y table to support and move the substrate.

25. The system of claim 20 wherein electro-optical means is provided to automatically make the alignments.

26. The system of claim 20 wherein said means for measuring and recording is a laser interferometer system.

27. A system for aligning a pattern mask with patterns located at a periodic array of sites on a photoresist coated substrate for step and repeat exposure of the photoresist to light passing through the mask, said system comprising;

a. means for supporting and moving the mask and substrate with respect to one another in parallel planes;
b. means for measuring and recording the X and Y coordinate position and distance of travel of the substrate;
c. system control means, said means including a control station;
d. a pair of spaced apart alignment marks on the mask which are separated by a known distance which is stored in said system control means;
e. patterns at two sites on the substrate with the patterns having corresponding pairs of spaced apart alignment marks which are separated by a known distance which is stored in said system control means;

f. alignment optics;

g. exposure means to image the pattern mask onto the photoresist coated substrate;

said system control means performing the functions of:

1. directing said system to move the substrate in response to electrical signals received from said control station until a first mark at the first site on the substrate is optically aligned with the first alignment mark on the mask;
2. directing said system to move the substrate translationally in response to electrical signals received from said control station until the first alignment mark at the first site is optically aligned with the second alignment mark on the mask while measuring the distance of travel of the substrate in X and Y orthogonal directions;
3. determining the distance between the mask alignment marks from the measured translational movement in X and Y of (2) as recorded by said means for measuring and recording and comparing the so determined distance between the first and second mask marks with the known distance in order to verify the accuracy of the alignments;
4. requiring further alignments as necessary until the accuracy is within a selected tolerance;
5. determining the rotational position of the mask with respect to the Y direction from the alignments which gave an accuracy within said predetermined limit;
6. directing said system to move the substrate translationally in response to electrical signals received from said control station until the second alignment mark at the first site on the substrate is optically aligned with the second mask mark while measuring the distance of travel of the substrate in the X and Y orthogonal directions;
7. determining the distance between the substrate alignment marks at the first site from the measured translational movement in X and Y of (6) as recorded by said means for measuring and recording and comparing the so determined distance with the known distance in order to verify the accuracy of the alignments;
8. requiring further alignments as necessary until the accuracy is within said predetermined limit;
9. determining the rotational positions of the substrate pattern with respect to the Y direction from the alignments which gave an accuracy within a predetermined limit;
10. directing said system to rotate the mask to bring it into rotational alignment with the patterns on the substrate based on the rotational position of the substrate and the mask relative to the Y direction;
11. determining the translational position of the center of the mask in the center of the pattern at said first site;
12. directing said system to move the substrate translationally to bring the mask and said first site into translational alignment;
13. directing said system to expose the photoresist at said first site by imaging the pattern mask onto the photoresist coated substrate, and;
14. directing said system to repeat (3) through (11) for each site of said array which is to be exposed.

28. The system according to claim 27 in which the pattern mask is replaced by a second pattern mask which is aligned with the substrate in order to expose a site on said substrate.

29. The system of claim 27 wherein the means for supporting and moving the mask and substrate inlcudes an X-Y table to support and move the substrate.

30. The system of claim 29 in which the substrate is a semiconductor wafer having a periodic array of device patterns.

* * * * *